(12) United States Patent
Chang et al.

(10) Patent No.: US 7,081,729 B2
(45) Date of Patent: Jul. 25, 2006

(54) VARIABLE-STRUCTURE DIAGNOSTICS APPROACH ACHIEVING OPTIMIZED LOW-FREQUENCY DATA SAMPLING FOR EMA MOTORING SUBSYSTEM

(75) Inventors: Jie Chang, Newbury Park, CA (US); Kirby Keller, Chesterfield, MO (US); Anhua Wang, Thousand Oaks, CA (US); Jiajia Zhang, Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 165 days.

(21) Appl. No.: 10/807,645

(22) Filed: Mar. 23, 2004

(65) Prior Publication Data

US 2005/0212523 A1     Sep. 29, 2005

(51) Int. Cl.
*G05B 23/02* (2006.01)
(52) U.S. Cl. .................. 318/565; 318/582; 244/195
(58) Field of Classification Search ........... 318/138, 318/254, 439, 561, 562, 565, 568.24, 582–586, 318/611, 623, 632; 388/907.5, 909; 244/194, 244/195, 226, 227, 230
See application file for complete search history.

(56) References Cited

U.S. PATENT DOCUMENTS

| | | | | |
|---|---|---|---|---|
| 5,555,195 A * | 9/1996 | Jensen et al. | ............... | 700/276 |
| 5,684,374 A * | 11/1997 | Chaffee | ....................... | 318/616 |
| 5,902,180 A * | 5/1999 | Sunaga et al. | ................ | 454/69 |
| 6,035,878 A * | 3/2000 | Adams et al. | ................. | 137/1 |
| 6,813,450 B1 * | 11/2004 | Barrett | ......................... | 399/9 |

* cited by examiner

*Primary Examiner*—Bentsu Ro
(74) *Attorney, Agent, or Firm*—Shimokaji & Associates, P.C.

(57) ABSTRACT

The present invention provides a diagnostics methodology and embedded electronic system that allows optimized low-frequency data sampling for EMA motoring subsystems in an operating vehicle. Each of the EMA motoring subsystems includes: an EMA; at least one motor for driving the EMA; and power controls for operating the motor, wherein the power controls includes a DSP controller for sampling and processing data at low-frequency sampling rates. The diagnostic methodology includes a method that has the steps of: determining an operational mode of the EMA motoring subsystem; selecting a sampling rate optimized for the determined operational mode; acquiring and processing data at the selected sampling rate; and analyzing the processed data to identify and classify a fault of the EMA motoring subsystem.

14 Claims, 5 Drawing Sheets

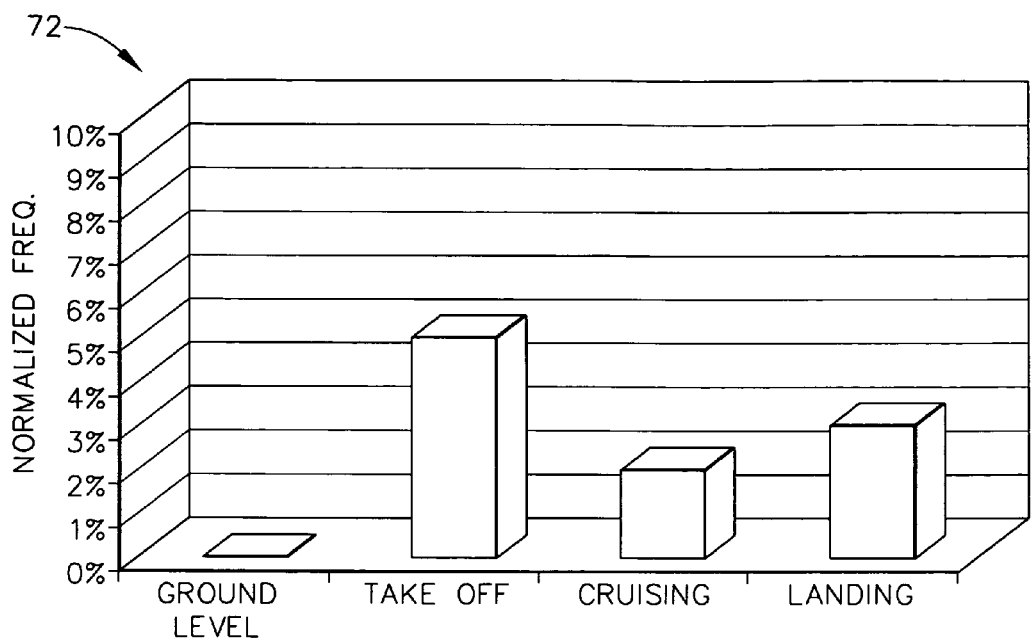
FIG. 5  MISSION STATES (LOWER BOUNDARY)
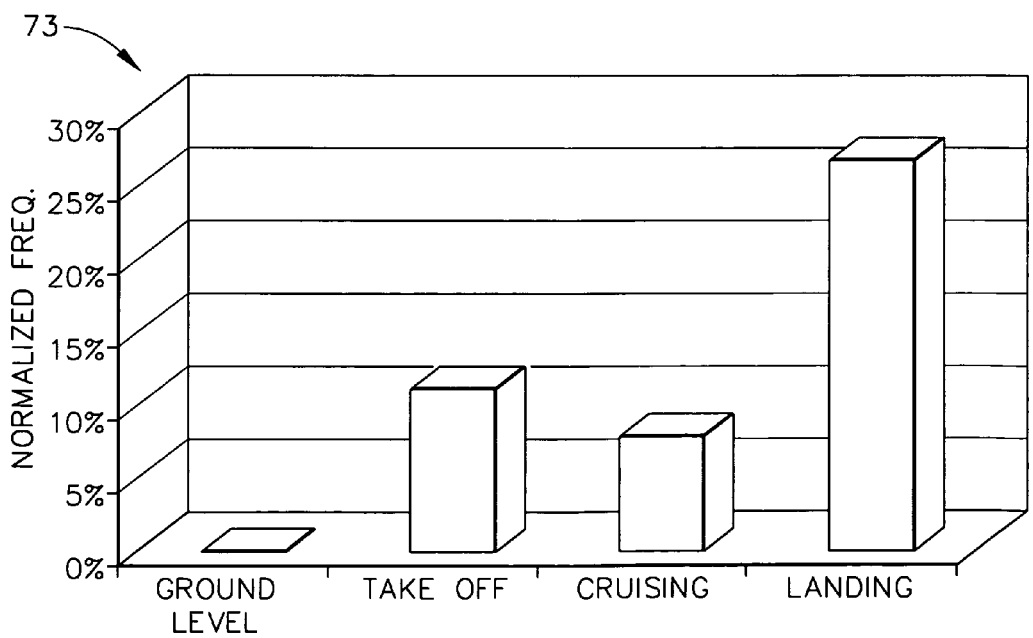
FIG. 6  MISSION STATES (UPPER BOUNDARY)

VARIABLE-STRUCTURE DIAGNOSTICS APPROACH ACHIEVING OPTIMIZED LOW-FREQUENCY DATA SAMPLING FOR EMA MOTORING SUBSYSTEM

GOVERNMENT RIGHTS

This invention was made with Government support under contract No. F33615-03-3-2306 of Aircraft Electrical Power Systems Prognostics and Health Management (AEPS-PHM) program awarded by United States Air Force. The Government has certain rights in this invention.

BACKGROUND OF THE INVENTION

The present invention generally relates to diagnostics of Electro-Mechanical Actuators (EMA) motoring subsystems, and more particularly, to variable structure-integrated diagnostic approach to achieve low-frequency data sampling for EMA motoring diagnostic subsystems.

There has been an increase in application of EMA and Electro-Hydrostatic Actuators (EHA) to flight and mission critical systems, such as spacecraft, military air vehicles and commercial aircraft. (Hereinafter, for simplicity, the term "EMA" refers to both EMA and EHA.) A diagnostic and prognostic capability of EMA is important since this capability enhances the system reliability of a mission and flight critical systems (i.e., flight control) which improves mission reliability and ensures safe in-flight operation. The concept is applicable to a broad range vehicles and systems that operate on land, sea or air and make use of EMA technology.

Prior art EMA motor diagnostics are based on additional or dedicated hardware circuits to collect and process the machine electrical variables. However, it is very desirable to develop integrated diagnostics for the EMA motoring or drive subsystem. This invention presents a novel approach of integrated diagnostics, motoring and adaptation system, using the embedded electronic circuit that already exists in the system for the EMA drive control. The technology described here also applies to situations were the EMA diagnostics must be implemented external to the embedded electronics but the local sources for computation, data collection and communications to move the necessary data to another processing element(s) are very limited.

Recent findings in the integrated diagnostics show that significant technical challenges must be overcome to meet various flight requirements for many new and valuable applications, such as Unmanned Combat Air Vehicles (UCAV).

One of the significant challenges stems from the limitations of the existing embedded microprocessor or DSP (digital signal processor) circuits. These processors are dedicated to control functions and have very limited available computational time that can be spared for diagnostics versus the high-priority real-time digital control tasks. The time-sharing of the real-time resources at high machine speeds (flight platform maneuvers which translates to EMA cycle activity) may be quite different from that of low machine speeds. At high machine speeds, the hardware has, effectively, a much shorter time frame to complete the same amount of data sampling and processing that is essential for the diagnostics. Herein, essential tasks for diagnostics may include continuous collecting, processing and evaluating substantial amount of machine data in a very short period. Alternatively, if the overall diagnostic processing is moved external to the embedded electronics this increases the requirement for additional communications resources.

Typically, the electrical motors that drive an EMA, such as Brushless-DC (BLDC) machines, are designed to operate at a high base frequency of the stator fundamental current. The higher the base operating frequency, the lower the volume and weight of the machine can be. The speed of a typical BLDC motor in an aircraft EMA system can range from 9,000 to 15,000 rpm. Therefore, there has arisen a need for diagnostics methodology to achieve low-frequency data sampling for EMA that operates at high base frequency. Furthermore, to optimize the low-frequency data sampling and processing at different mission phases or activity of the aircraft, the diagnostic and motoring system methodology should be able to select and identify the proper operational mode of the platform.

Another issue stems from the potential degrading of the accuracy of machine modeling at high machine speeds. As an example, a model-based approach can be applied to detect the early phase of machine's bearing surface wear based on the increase of the rotational resistant torque on the motor shaft. At high machine speeds, the machine's windage losses can be non-negligible and can affect the accuracy of the model-based approach. Therefore, there has arisen a need for diagnostic methodology that is immune to the effects of windage loss and can provide accurate diagnostic output while using limited computing and/or communications resources.

As can be seen, there is a critical need to develop new diagnostics methodology and embedded electronic system that enables optimized low-frequency data sampling and reduced data processing rate for EMA motoring subsystems. This new approach and techniques reduce the cost of processing and communications hardware required to implement the diagnostics and prognostics in real time. The new diagnostics methodology and system select and identify the proper operational mode of EMA positioning control during different mission phases to optimize the low-frequency data sampling and processing. Moreover, the new approach of a diagnostics and prognostics methodology allows EMA motoring subsystems to detect the incipient failure symptoms and predict a pending failure mode of an electrical machine and actuator in the subsystems. Furthermore, such diagnostics methodology can be extended to estimate the remaining machinery life within a reasonable statistical confidence bound, which will greatly reduce the risk of any untimely failure or downtime during the operation, assure the mission readiness, facilitate timely and cost effective system maintenance, reduce the life-cycle cost (LCC), and reduce the turn around time of the subsystems.

SUMMARY OF THE INVENTION

The present invention provides a diagnostics methodology and embedded electronic system that allows optimized low-frequency data sampling for EMA motoring subsystems. The present invention also conceives and integrates a new methodology that first selects and identifies the proper operational mode of the flight system control during different mission phases, and then adaptively determine the optimized low-frequency for data sampling and processing in addition to the integrated hardware and software systems for multiple fault diagnostics using the same hardware and software.

In one aspect of the present invention, a method for performing an integrated diagnostics of an EMA motoring subsystem is disclosed. The EMA motoring subsystem has multiple operating substructures for diagnostics, wherein each of the structures has an optimum data sampling rate. In such a method, an operational mode of the EMA motoring subsystem is determined using key state variables of the EMA motoring subsystem. Next, based on the determined operational mode, the corresponding one of the multiple operating structures is selected. Subsequently, multiple-channel data are acquired using the selected operating structure and analyzed to identify and classify degradations of the EMA motoring subsystem.

In another aspect of the present invention, a systematic methodology for performing integrated diagnostics of an EMA motoring subsystem in a flying vehicle at a low-frequency sampling rate includes steps of: determining a mission phase or operating mode of a flying vehicle; identifying and selecting a pseudo-steady-state operating condition of an EMA motoring subsystem of the flying vehicle based on the determined flight mission phase; sampling and processing data at a low-frequency sampling rate optimized for the selected pseudo-steady-state operating condition; and identifying and classifying a fault of the EMA motoring subsystem based on the processed data.

In still another aspect of the present invention, a method for identifying a pseudo-steady-state operating condition of an EMA motoring subsystem in an operating vehicle includes steps of: determining a mission phase of an operating vehicle; assessing key state variables of an EMA motoring subsystem in the vehicle; and identifying a pseudo-steady-state operating condition of the EMA motoring subsystem based on the determined mission phase combined with the assessed key state variables.

In yet another aspect of the present invention, a method for performing integrated diagnostics and prognostics of an EMA motoring subsystem in a flying vehicle includes steps of: monitoring an operational status of an EMA motoring subsystem of a flying vehicle; determining an operational mode of the EMA motoring subsystem based on key state variables of the EMA motoring subsystem and a mission phase of the flying vehicle; selecting data sampling and processing rate optimized for the determined operational mode; acquiring multi-channel data at the selected sampling rate; storing the acquired data to a memory through a DMA channel; analyzing condition of the EMA motoring subsystem using the stored data; identifying and classifying a fault of the EMA motoring subsystem based on the analyzed condition; and predicting a failure mode of the EMA motoring subsystem based on the analyzed condition.

In a further aspect of the present invention, a method for performing integrated diagnostics and prognostics of an EMA motoring subsystem in a flying vehicle includes steps of: creating a plurality of operating structures into an EMA diagnostics and motoring subsystem of a flying vehicle, each operating structure having a data sampling rate; monitoring an operational status of the EMA motoring subsystem; determining a mission phase of the flying vehicle; assessing key state variables of the EMA motoring subsystem; selecting one of the plurality of operating structures based on assessed key state variables and the determined mission phase; acquiring multi-channel data using the selected operating structure; storing the acquired data to a memory through a DMA channel; analyzing condition of the EMA motoring subsystem using the stored data; identifying and classifying a fault of the EMA motoring subsystem based on the analyzed condition; and predicting a failure mode of the EMA motoring subsystem based on the analyzed condition.

In additional aspect of the present invention, an EMA motoring subsystem includes: an EMA; at least one motor for driving the EMA; and power controls for operating the motor, wherein the power controls includes a DSP controller for sampling and processing data at multiple sampling rates.

In yet additional aspect of the present invention, an EMA motoring subsystem includes: a gearbox having a plurality of gears; a ball screw ram for transforming rotary motion of the plurality of gears into linear displacement; at least one motor for driving the plurality of gears; and power controls for operating the at least one motor, the power controls including a DSP controller for sampling and processing data at a plurality of sampling rates.

In still additional aspect of the present invention, a vehicle has at least one EMA motoring subsystem that includes: an EMA; at least one motor for driving the EMA; and power controls for operating the motor, wherein the power controls includes a DSP controller for sampling and processing data of multiple channels at multiple sampling rates.

In further additional aspect of the present invention, an operating vehicle has at least one EMA motoring subsystem that includes: the power controls including a DSP controller for sampling and processing data at a plurality of sampling rates. The vehicle further includes: a control system; a GUI for demonstrating and testing the EMA motoring subsystem; and a vehicle management computer for analyzing the data processed by the DSP controller to increase confidence level of the data, providing the DSP controller with information to support the DSP controller's selection of monitoring mode and sending the data to the control system. The vehicle management computer is connected to the DSP controller, the GUI and the control system.

These and other features, aspects and advantages of the present invention will become better understood with reference to the following drawings, description and claims.

BRIEF DESCRIPTION OF THE DRAWINGS

FIG. 5 is a plot of the lower boundary of a conventional BLDC motor's operational frequencies normalized with respect to its nominal based frequency during the four flight mission phases;

FIG. 6 is a plot of the upper boundary of a conventional BLDC motor's operational frequencies normalized with respect to its nominal based frequency during the four mission phases.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention provides variable-structure diagnostics approach for EMA motoring subsystems, wherein data for diagnostics and prognostics of the EMA motoring subsystems are enabled to be taken at low-frequency sampling rates in contrast to the existing approaches that sample data only at high frequencies. The present invention provides a method for identifying a pseudo-steady-state operating condition of the EMA subsystems so that, unlike the prior art, an optimum low-frequency sampling rate for the identified operating condition can be determined. Furthermore, the present invention provides diagnostics and prognostics methodology to detect the incipient failure symptoms and predict a pending failure mode of an electrical machine and actuator in the EMA motoring subsystems. An EMA motoring subsystem having such diagnostics capability may be applied to mission critical systems, such as unmanned military aircraft, spacecraft and ground and sea based craft, which have computer systems of limited speed and time available for data sampling and processing required for the diagnostics in real time. The integrated diagnostics capability disclosed in one embodiment of the present teachings can enable the mission critical systems to perform diagnostics and prognostics of the EMA motoring subsystem detecting multiple faults using the same embedded hardware and employing optimized low-frequency data sampling and processing.

Figure 1:
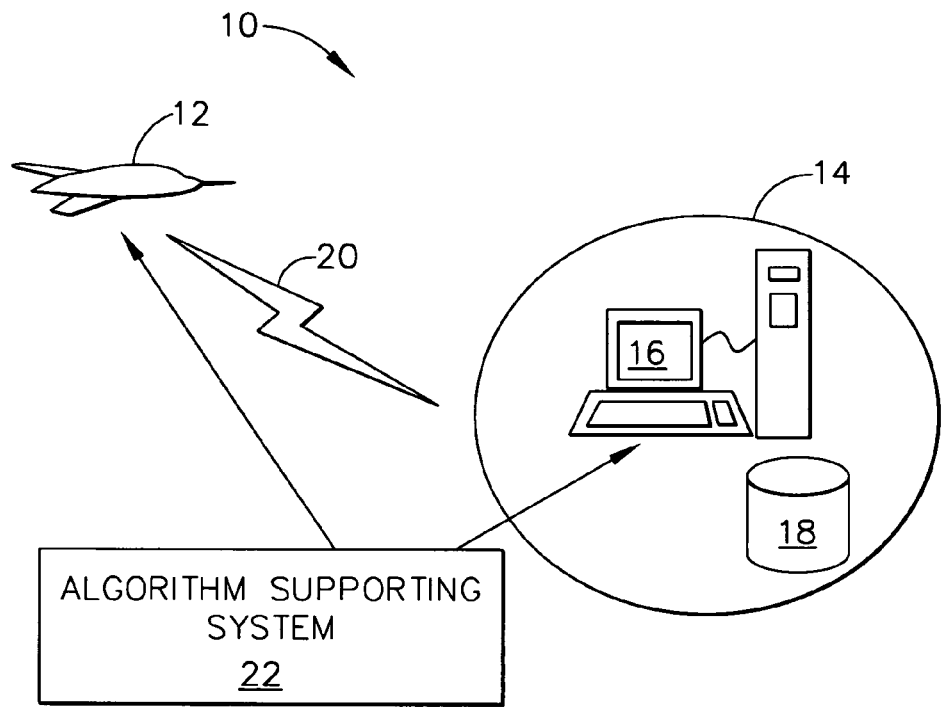
FIG. 1 is a schematic diagram of a system for Aircraft Electrical Power System Diagnostics, Prognostics and Health Management (AEPS-PHM) in accordance with one embodiment of the present teachings.

FIG. 1 is a schematic diagram of a system 10 for Aircraft Electrical Power System Diagnostics, Prognostics and Health Management (AEPS-PHM). The system 10 includes: an aircraft 12; a ground based health management system 14 for receiving data from and sending updated EMA control software to the aircraft 12 through a wireless connection 20, the health management system 14 comprising a computer system 16 and a data warehouse 18; an algorithm supporting system 22 for providing diagnostic, anomaly and prognostic algorithm to the aircraft 12 and the health management system 14; and other engineering analysis system (not shown in FIG. 1) for engineering support, web access, and data mining via a connection to the health management system 14. It should be apparent to one of ordinary skill in the art that the aircraft 12 can also represent one of the mission critical spacecraft, such as a shuttle evolved vehicle or one of several concepts for light weight, easily transportable land or sea based autonomous vehicle concepts now being explored in systems such as the US Army's Future Combat System.

Figure 2:
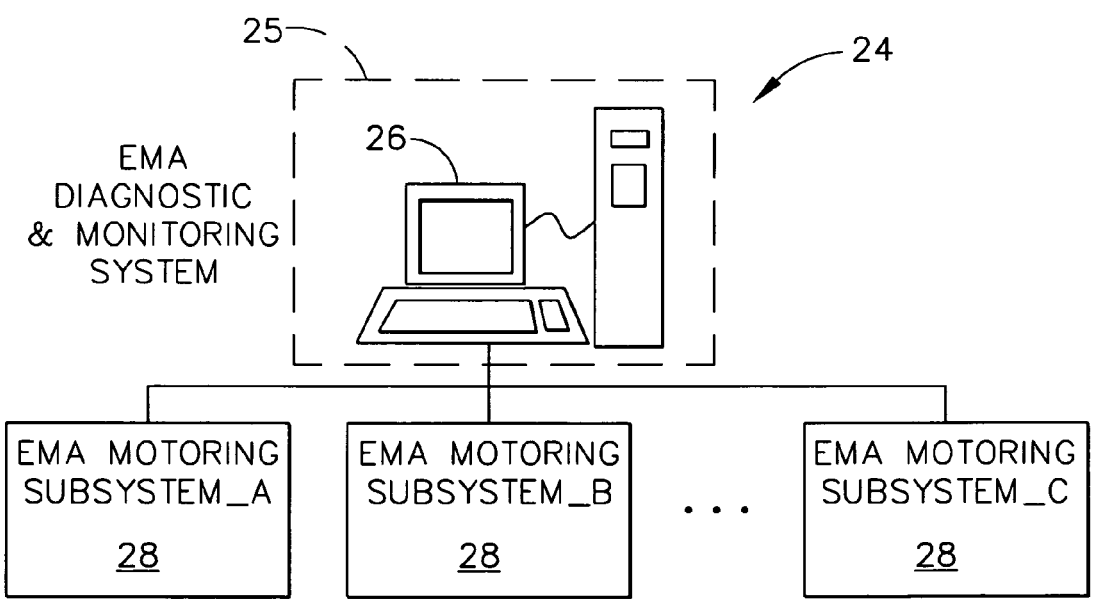
FIG. 2 is a schematic diagram of an onboard diagnostics and health management system in accordance with one embodiment of the present teachings.

The aircraft 12 can carry an onboard health management system for EMA systems. In FIG. 2, a schematic diagram of an onboard health management system 24 embedded in the aircraft 12 is shown. The system 24 includes: EMA motoring subsystems 28 operating in accordance with one embodiment of the present teachings; and a computer system 26 for data link to ground based health management system 14 via wireless connection 20 and for data processing and laboratory simulation of the subsystems 28. Each of the subsystems 28 may be connected to the computer system 26 to provide data acquired at optimum sampling rate, as will be explained later.

Figure 3:
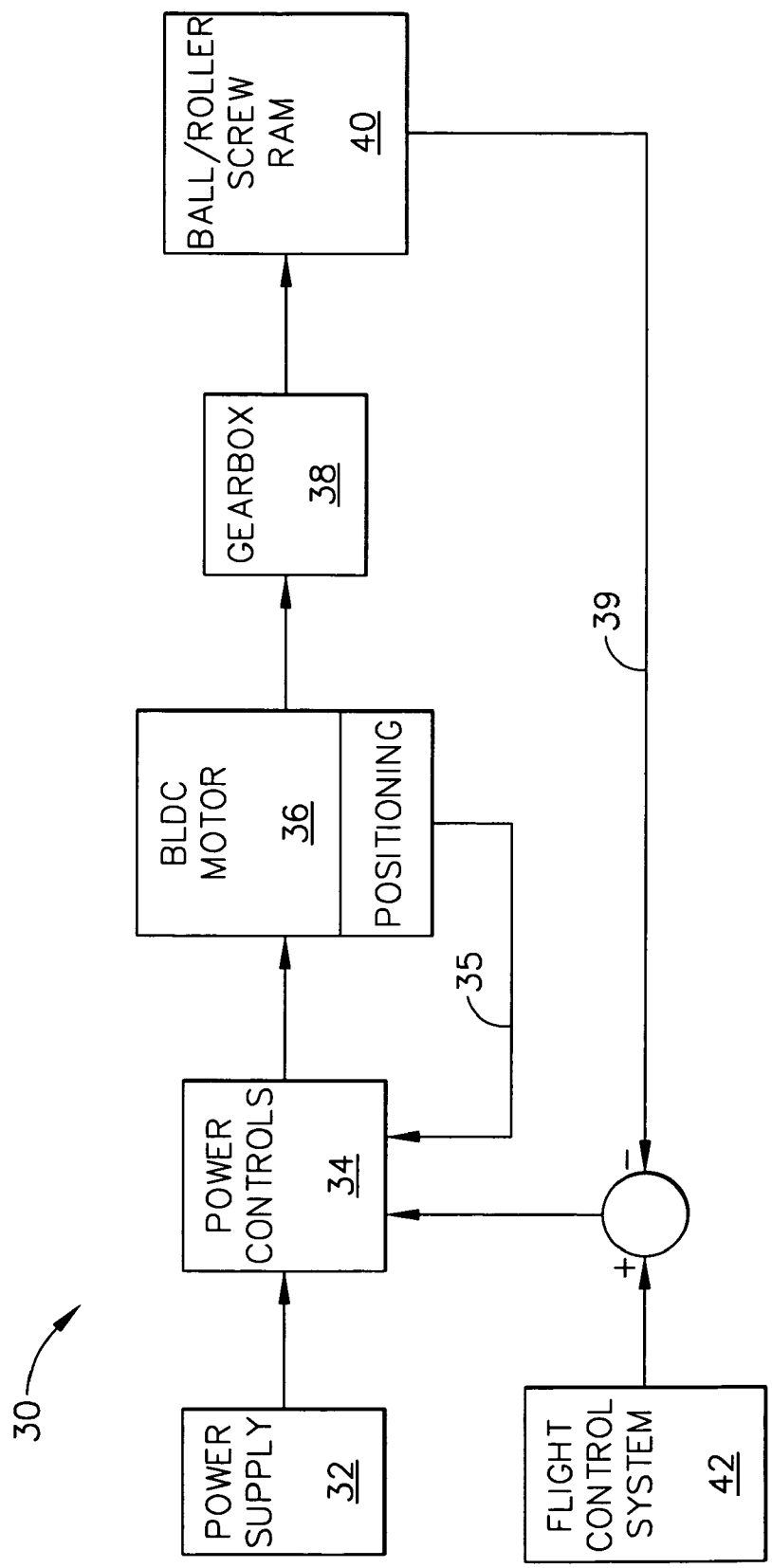
FIG. 3 is a simplified block diagram of an EMA motoring subsystem embedded in the onboard diagnostics and health management system of FIG. 2.

FIG. 3 shows a simplified block diagram 30 of one of the EMA motoring subsystems 28. As illustrated, each subsystems includes: a power controls 34 for receiving electric power from a power supply 32 and command signal from a flight control system 42 (or, equivalently Higher Level Controls); a BLDC motor 36 connected to and controlled by the power controls 34; a gearbox 38 having gears, the gearbox 38 being operated by the BLDC motor 36; and a ball screw ram 40 for transforming rotary motion of the gears into linear displacement.

The present invention uses the local embedded hardware in each of the EMA motoring subsystems 28 to perform the low-level tasks for diagnostics, wherein the essential tasks include sampling of the positioning data of the BLDC motor 36 and initial data processing. In one embodiment of the present teachings, the BLDC motor's positioning data may be sampled and sent to DSP controller in 34 to form a feedback loop as indicated by an arrow 35 in FIG. 3. Also, the linear displacement data of the ball screw ram 40 may be converted into an electric signal 39 and sent to the power controls 34.

Figure 4:
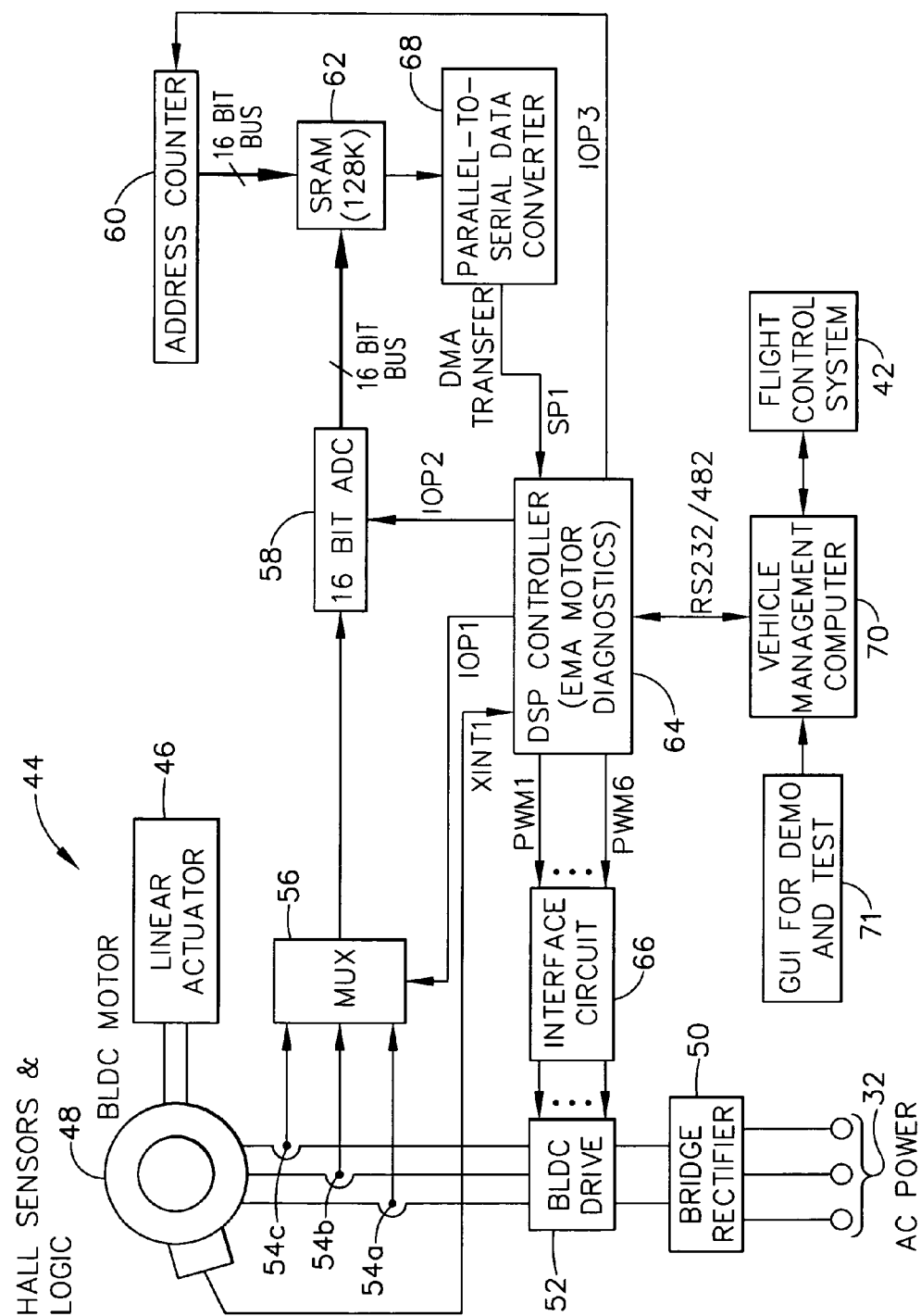
FIG. 4 is a schematic diagram of an integrated and embedded system architecture for an EMA motoring subsystem in accordance with another embodiment of the present teachings.

FIG. 4 shows a schematic diagram of an integrated system architecture 44 that may be embedded in one of the EMA motoring subsystems 28 according to the present teachings. Each of the EMA motoring subsystems 28 includes: a BLDC motor & actuator 46 having the BLDC motor 36, the gearbox 38 and the ball (or roller) screw ram 40 (in FIG. 3); a Hall sensors & logic 48 for controlling the BLDC motor & actuator 46; bridge rectifier 50 for rectifying the power from a power supply 32; a BLDC drive 52; sensors 54 for measuring the output signal from the BLDC drive 52; a multiplexing device 56 for multiplexing signals from the sensors 54; a 16-bit ADC 58 for converting analogue signals from the multiplexing device 56 into digital signals; an address counter 60; a SRAM 62 connected to the 16-bit ADC and the address counter 60 via 16-bit bus, the size of SRAM 62 being preferably, but not limited to, 128K; a Parallel-to-Serial data converter 68 for converting the data from the SRAM 62 into a serial data; a DSP controller 64 that can be transformed to the DSP by direct memory access (DMA) approach without using normal CPU time; and an interface circuit 66 for converting pulse-width-modulation (PWM) signals from the DSP controller 64 into analogue signals that control the converter circuit of the BLDC drive 52.

In one embodiment of the present teachings, EMA motor diagnostics software may be implemented in the DSP controller 64 as part of the actuator control wherein the DSP controller 64 can be, but not limited to, a Texas Instruments DSP controller (model No. TMS320LF2406). The software in the DSP controller 64 generates diagnostic output that can be directly exploited by the interface circuit 66.

In another embodiment of the present teachings, a vehicle management computer 70 may be connected to DSP controller 64, as shown in FIG. 4. In this embodiment, the information passing from the DSP controller 64 to the vehicle management computer 70 consists of the results of the health management processing performed within the DSP controller 64. This is an estimate of motor health based on the local state variables (e.g., control inputs, motor states) local to the DSP controller 64. This information can be fused or integrated with other diagnostic/prognostic results within vehicle management computer 70 to reduce the ambiguity and increase the confidence in the estimate of actuator system's (includes gear drive, motor, controller) health. The vehicle management computer 70 provides the DSP controller 64 an indication of mission phase and/or actuator surface activity that supports the DSP controller's 64 selection of monitoring mode.

In an alternative embodiment of the present teachings, the vehicle management computer 70 may be further connected to the control system 42. The output of the vehicle management computer 70 can be exploited by the control system 42 (e.g., loss of responsiveness of a control surface being driven by the actuator of interest). Yet another embodiment may include the vehicle management computer 70 connected to a GUI (graphic user interface) 71 that demonstrates and tests the EMA motoring subsystems 28.

Typically, the BLDC motor 36 can run over 9,000 to 15,000 rpm. The machine design using higher base frequency may be preferred as the volume and weight of the BLDC motor 36 can be lowered. Diagnostics and prognostics of the EMA motoring subsystems 28 having such high-speed (frequency) motor raise technical challenges since the microprocessor or DSP controller 64 has limited speed and computational time spared for the diagnostics. To overcome these technical challenges, a novel approach is needed and disclosed herein. That allows the EMA motoring subsystems 28 according to the present teachings to perform the essential tasks for diagnostics/prognostics at low-frequency sampling rates.

The concept of the low-frequency data sampling rates for the EMA motoring subsystems 28 is based on the present inventors' assessment that the motor high speeds take place only on the large signal mode of EMA's position control process. Extensive modeling and analysis shows that the BLDC motor's operational frequencies can be much lower than its nominal based frequency during pseudo-steady-state operating mode (or equivalently pseudo-small-signal mode) of the EMA. FIG. 5 is a plot 72 of the lower boundary of a conventional BLDC motor's operational frequencies normalized with respect to its nominal based frequency during the four mission phases: on-ground, take-off, cruise, and landing. FIG. 6 shows a plot 73 of the upper boundary of a conventional BLDC motor's operational frequencies normalized with respect to its nominal based frequency during the four mission phases. As can be noticed in FIGS. 5 and 6, the BLDC motor's operational frequencies in the identified pseudo-steady-state mode during the four mission phases may be lower than 30% of the nominal based frequency.

The variable-structure diagnostics approach of the present teachings identifies the pseudo small signal mode and enables the essential diagnostics tasks to be performed at optimized low-frequency sampling rates. This approach reduces the stringent requirements for more expensive hardware and high-frequency data acquisition, transfer and processing, thus reducing the hardware design, component counts, and cost and increasing reliability.

In one embodiment of the present teachings, each of the diagnostic system of the EMA motor subsystems 28 has main operating structures for two operating modes: pseudo-steady-state operating mode and large signal mode. An alternative embodiment includes multiple operating structures for pseudo-steady-state operating mode, wherein each structure corresponds to one of the several mission phases of the aircraft 12: on-ground, take-off, cruise, and landing. The identifications and selections of pseudo-steady-state operating conditions may be achieved by assessing key state variables of the EMA motoring system, such as position of ball roller screw ram, motor position, motor phase current, motor supply voltage, and actuator position.

Figure 7:
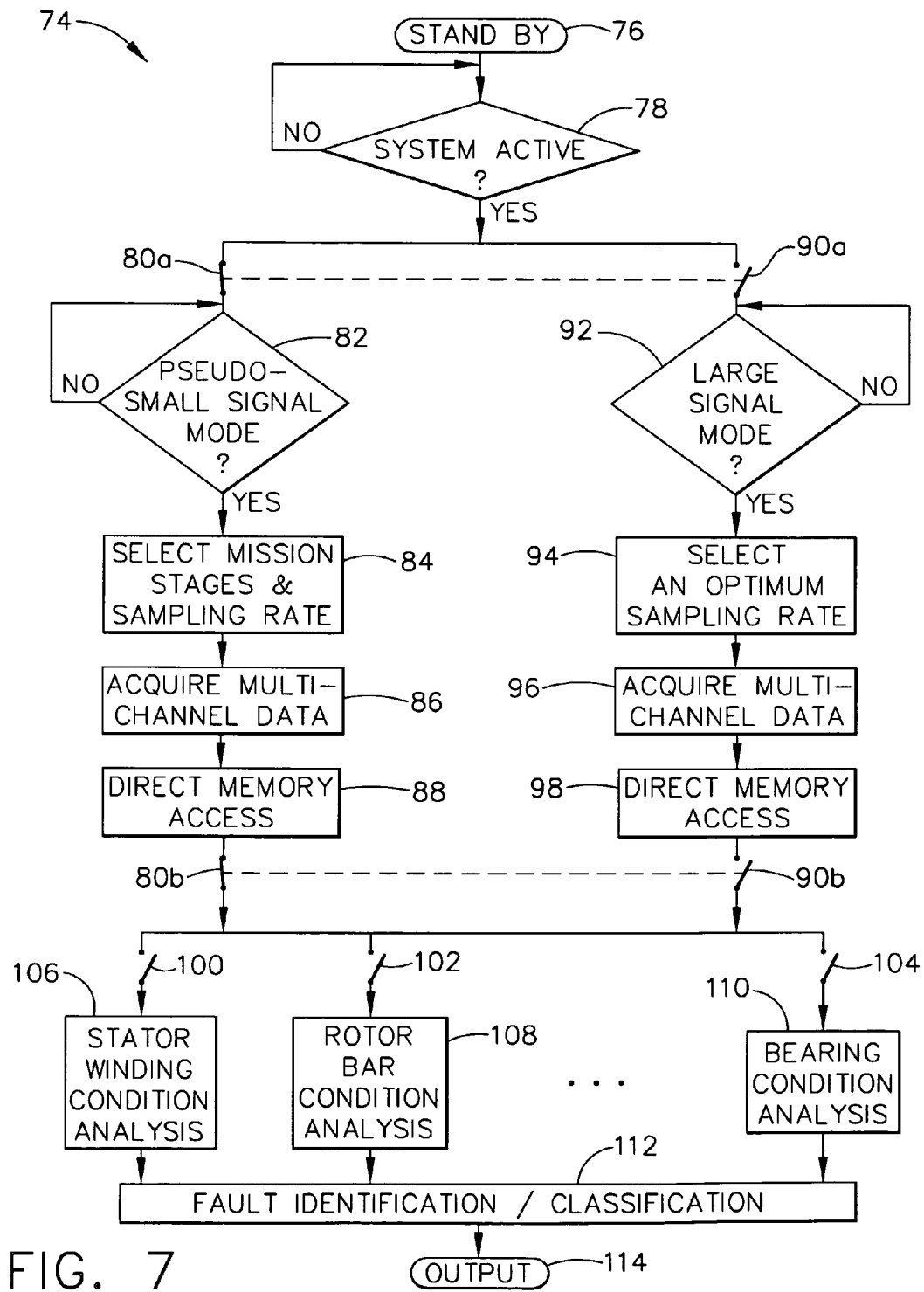
FIG. 7 is a block diagram of a variable-structure diagnostics approach for an EMA motoring subsystem in accordance with one embodiment of the present teachings, governing the overall control flow of the integrated and embedded diagnostic system performing multiple fault diagnostics with optimized low data sampling frequencies.

Referring now to FIG. 7, a block diagram 74 of the variable-structure diagnostics approach is illustrated in accordance with one embodiment of the present teachings. Step 76 represents the stand-by mode for monitoring the operational status of EMA motoring subsystems 28. Upon the subsystems 28 being active in step 78, its operational mode may be determined in steps 82 and 92. Switches 80a and 90a may be mutually exclusive and correspond to pseudo-small-signal mode and large signal mode, respectively. If the operational mode is determined to be the pseudo-small-signal mode in step 82, the switch 80a may be turned on as shown in FIG. 7. In step 84, one mission phase may be selected amongst the four phases: on-ground, take-off, cruise and landing. Then, based on the selected mission phase and key state variables of the EMA motoring subsystems 28, the operational condition (and, consequently a sampling rate) may be determined referencing the access-ment data profile given in FIGS. 5 and 6. At the determined optimal low sampling rate, multi-channel data including key state variables and sampled data from the EMA motoring subsystems 28 may be acquired in step 86 and the acquired data may be sent to memory through DMA channel in step 88 and shown in FIG. 4. The switch 80b may be synchronized with switch 80a.

If the operation mode is determined to be the large-signal mode in step 92, the switch 90a may be turned on. In step 94, the EMA motoring subsystem selects an optimum sampling rate for the large signal mode. Then, multi-channel data may be acquired at the selected sampling rate in step 96 and the acquired data may be sent to memory through DMA channel in step 98. Switch 90b may be synchronized with the switch 90a.

The steps 76–98 can be set for diagnostics of the EMA motoring subsystems 28. In FIG. 7, the switch 100 can be turned on to analyze the condition of stator winding subsystem in step 106. Switches 102 and 104 correspond to the analysis of the condition of rotor bar subsystem in step 108 and bearing subsystem in step 110, respectively. Even though FIG. 7 shows only three fault determining and monitoring subsystems, it should be apparent to one of skill in the art, that the embodiment of the present teachings is not limited to only three fault motoring and analysis subsystems.

The results from steps 106, 108 and 100 may be used to identify and classify a fault of the EMA motoring subsystems 28 in step 112. For example, in step 106, the output from the stator winding analysis may be sent to vehicle management computer 70 or ground based health management system 14 for further classification analysis and prognosis of the EMA motoring subsystems 28.

It should be understood, of course, that the foregoing relates to preferred embodiments of the invention and that modifications may be made without departing from the spirit and scope of the invention as set forth in the following claims.

We claim:

1. A method for performing an integrated diagnostics of an EMA motoring subsystem using embedded electronic control circuits, the method comprising:

implementing a plurality of operating structures into an EMA motoring subsystem, each operating structure having optimized rates of data sampling and processing;

determining an operational mode of the EMA motoring subsystem;

selecting one of the implemented plurality of operating structures that corresponds to the determined operational mode;

acquiring multi-channel data using the selected operating structure; and analyzing the acquired data to identify and classify a fault of the EMA motoring subsystem.

2. A method of variable structure diagnostics system, comprising:

implementing a plurality of operating structures into an EMA motoring subsystem, each operating structure having optimized rates of data sampling and processing;

determining an operational mode of the EMA motoring subsystem;

selecting one of the implemented plurality of operating structures that corresponds to the determined operational mode;

acquiring multi-channel data using the selected operating structure; and analyzing the acquired data to identify and classify a fault of the EMA motoring subsystem.

3. The method of claim 2, wherein the determined preferred operational mode of a low sampling frequency is a pseudo-small-signal mode.

4. The method of claim 2, wherein the determined operational mode is a large signal mode in complementary to the pseudo-small-signal mode.

5. The method of claim 2 identifies the vehicle mission states combining with the estimation of the pseudo-small-signal mode, further reducing the rate of the data sampling and processing.

6. A method for performing integrated diagnostics of an EMA motoring subsystem in a flying vehicle at a low-frequency sampling rate, the method comprising:

determining a mission phase of an operating vehicle;

selecting a pseudo-steady-state operating condition of an EMA motoring subsystem of the operating vehicle based on the determined mission phase;

sampling and processing data at a low-frequency sampling rate optimized for the selected pseudo-steady-state operating condition; and identifying and classifying a fault of the EMA motoring subsystem based on the processed data.

7. The method of claim 6, wherein the determined mission phase is on-ground, take-off, cruise or landing phase.

8. The method of claim 6, further including the step of:

predicting the fault of the EMA motoring subsystem based on the processed data.

9. The method of claim 6, wherein the operating vehicle is an Unmanned Combat Air Vehicle (UCAV), a shuttle evolved vehicle or new manned space vehicle, a commercial aircraft, a land based autonomous craft, a land based manned craft, a sea based autonomous craft or a sea based manned craft.

10. A method for performing integrated diagnostics and prognostics of an EMA motoring subsystem in a vehicle, the method comprising:

monitoring an operational status of an EMA motoring subsystem of a vehicle;

determining an operational mode of the EMA motoring subsystem based on key state variables of the EMA motoring subsystem and a mission phase of the vehicle;

selecting sampling rate optimized for the determined operational mode;

acquiring multi-channel data at the selected sampling rate;

storing the acquired data to a memory through a DMA channel;

analyzing condition of the EMA motoring subsystem using the stored data;

identifying and classifying a fault of the EMA motoring subsystem based on the analyzed condition; and predicting the fault of the EMA motoring subsystem based on the analyzed condition.

11. A method of claim 10, wherein the determined operational mode is a pseudo-small-signal mode or a large signal mode.

12. A method of claim 10, wherein the selected sampling rate is an optimum sampling rate for the large signal mode.

13. A method of claim 10, wherein the EMA motoring subsystem is a stator winding, a rotor bar or a bearing system.

14. A method for performing integrated diagnostics and prognostics of an EMA motoring subsystem in a vehicle, the method comprising:

implementing a plurality of operating structures into an EMA motoring subsystem of a vehicle, each operating structure having a data sampling rate;

monitoring an operational status of the EMA motoring subsystem;

determining a flight mission phase of the vehicle;

assessing key state variables of the EMA motoring subsystem;

selecting one of the plurality of operating structures based on assessed key state variables and the determined flight mission phase;

acquiring multi-channel data using the selected operating structure;

storing the acquired data to a memory through a DMA channel;

analyzing condition of the EMA motoring subsystem using the stored data;

identifying and classifying a fault of the EMA motoring subsystem based on the analyzed condition; and predicting the fault of the EMA motoring subsystem based on the analyzed condition.

* * * * *